United States Patent [19]

Takakura

[11] Patent Number: 5,164,285
[45] Date of Patent: * Nov. 17, 1992

[54] METHOD FOR FORMING PLATE CHARACTERS IN A HALF-TONE GRAVURE PLATEMAKING PROCESS

[75] Inventor: Kouichi Takakura, Kashiwa, Japan

[73] Assignee: Think Laboratory Co., Ltd., Chiba, Japan

[ * ] Notice: The portion of the term of this patent subsequent to May 28, 2008 has been disclaimed.

[21] Appl. No.: 589,170

[22] Filed: Sep. 26, 1990

[30] Foreign Application Priority Data

Sep. 27, 1989 [JP] Japan ................. 1-251229

[51] Int. Cl.⁵ ............................................. G03F 7/004
[52] U.S. Cl. ..................................... 430/307; 430/300;
101/150; 101/170; 101/401.1
[58] Field of Search .............................. 430/300, 307;
101/401.1, 150, 170

[56] References Cited

U.S. PATENT DOCUMENTS

| 2,210,923 | 8/1940 | Jacquerod et al. | 101/401.1 |
| 3,980,018 | 9/1976 | Ichikawa | 101/401.1 |
| 5,019,486 | 5/1991 | Takakura | 430/307 |

FOREIGN PATENT DOCUMENTS 55-124150  9/1980  Japan ..................... 430/307

Primary Examiner—Marion E. McCamish
Assistant Examiner—Janis L. Dote
Attorney, Agent, or Firm—Koda and Androlia

[57] ABSTRACT

A method for forming plate characters in a half-tone gravure platemaking process wherein the laser beam is moved so that it will be irradiated on a light sensitive material for forming a plate character on the light-sensitive material by exposure. The plate character is made with a frame portion and a filling portion. The frame portion is formed with continuous groove-form cells which have a predetermined length and width and dot-form projections are formed in the groove-form cells for preventing ink flow. The filling portion is formed by dot-form cells which have a shadow-portion dot percentage.

2 Claims, 1 Drawing Sheet

METHOD FOR FORMING PLATE CHARACTERS IN A HALF-TONE GRAVURE PLATEMAKING PROCESS

BACKGROUND OF THE INVENTION

1. Field of the Invention

The present invention relates to a method for forming plate characters in a half-tone gravure platemaking process which provides the same character quality as is found in type printing.

1. Prior Art

FIGS. 2(a) through 2(c) show a process of printing a letter "A" formed by a plate character obtained by prior art half-tone gravure platemaking method. FIG. 2(a) shows a plate character "A" with a screen applied thereto, and the entire plate character consists of dot-form cells. The dot-form cells are formed by etching so that they have a shadow-portion dot percentage.

FIG. 2(b) shows a screen-applied plate character "A" of FIG. 2(a) upon which ink has been applied. When transfer-printing is performed onto paper, etc., the ink spreads and the blank-paper portions left by screen wires disappear, thus producing a letter "A" in which the entire character is black as shown in FIG. 2(c).

Thus, conventionally, plate characters are made up of dot form cells which have a shadow-portion dot percentage. Accordingly, the frames (or outlines) of the half-tone gravure characters (printed characters) are notched, and its quality is inferior to that of type-printed characters. Particularly, the quality of small characters is very low.

In an attempt to solve the problems described above, the inventor of the present application filed a patent application in Japan (Japanese Patent Application No. 1-171382). According to the method for forming plate characters in a half-tone gravure platemaking process described in this Japanese patent application, the ink in the character frame portions (or along the character outlines) is thick, and the character frame portions are far sharper than that obtained in type printing. Also, the character fill portions become solid black, accomplishing a high-quality character printing. However, this method has some problems. If aqueous inks which have a somewhat high fluidity are used, ink flow occurs in the character frame portions.

SUMMARY OF THE INVENTION

Accordingly, the object of the present invention is to provide a method for forming plate characters in a half-tone gravure platemaking process, wherein sharp character frames (such as those seen in type printing) in half-tone gravure characters are obtained, and a high-quality character printing is accomplished without causing any ink flow in the character frame portion.

The method for forming plate characters of the present invention is characterized by the fact that (a) a laser beam emitted from a laser exposure device is moved so that the laser beam is intermittently irradiated onto a light-sensitive material, thus forming a plate character on the light-sensitive material by exposure, (b) the plate character is made up with a character frame portion and a character fill portion which is surrounded by the character frame portion, (c) the character frame portion is formed by continuous groove-form cells which have a prescribed length and width and by dot-form projections that prevent ink flow, and (d) the character fill portion is formed by dot-form cells which have a shadow-portion dot percentage.

The half-tone gravure printing plates (in rolls or flat plates) of the present invention, as described above, have character frame portion formed by continuous groove-form cells, having a sufficiently small width. Also, dot-form projections are formed in the groove-form cells so that ink flow does not occur in the cells. In addition, the character fill portion is formed by dot-form cells which have a shadow-portion dot percentage. Accordingly, when the plate surface is wiped by a doctor, ink is applied in a favorable manner to the entire surface of the plate character, i.e., to both the character frame portion and the character fill portion, so that ink flow does not occur at the character frame portion when the character plate is wiped by a doctor. As a result, the ink in the character frame portion of the printed character is thick, and the character frame portion can be far sharper than that of type printing. In addition, the character fill portion is black, accomplishing high-quality character printing.

DETAILED DESCRIPTION OF THE INVENTION

A description of the present invention will be made below with reference to a direct platemaking process in which a laser beam is moved so that the laser beam is intermittently irradiated (or flashed) onto the surface of a plate roll, which is coated with a light-sensitive film, thus causing a formation of character information (by exposure) as an aggregation of beam dots.

In other words, a single laser beam is split by a beam splitter into approximately 20 beams, which are of equal intensity and arranged in chain form, and each beam is irradiated onto a plate roll (which is coated with a light sensitive film to constitute the light-sensitive material) by a multi-type light modulator (which is driven in accordance with character information) and through auto-focus lenses, so that laser exposure is performed as the laser scans.

When a letter "A", for example, is to be written onto the plate roll by laser exposure, multi-electrodes of a multitype light modulator are driven so that the character frame portion is continuously exposed (by the laser beams) and the character fill portion (i.e., the area inside the character frame portion) is exposed so that the character fill portion is filled with dot-form cells having a shadow-portion dot percentage.

The multi-type light modulator is driven so that it receives character information from a memory which stores such character information, converting such information into necessary signals and then distributing the signals to the multi-electrodes. The character information stored in the memory is laid out together with image information in a layout scanner.

Figure 1:
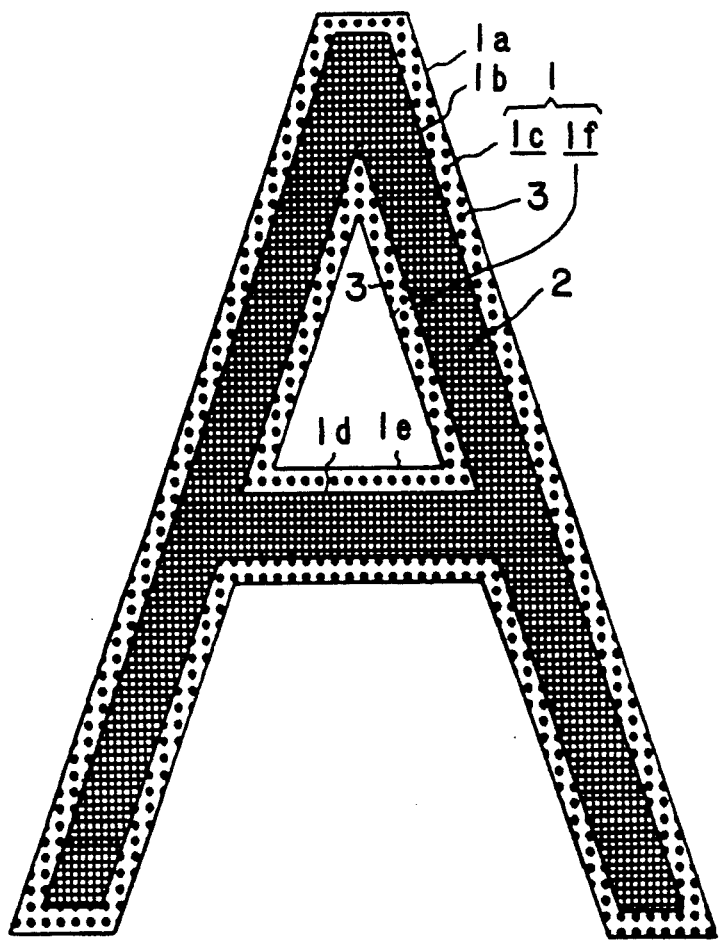
FIG. 1 is an enlarged illustration of a plate character formed by the method of forming plate characters in a half-tone gravure platemaking process of the present invention.
Figure 2A:
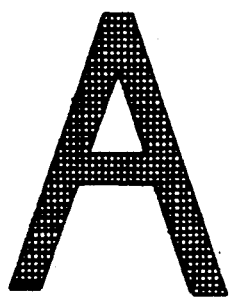
FIGS. 2(a) through 2(c) show a process of forming and printing a half-tone gravure character by means of a conventional method of forming plate characters in a half-tone gravure platemaking process.
Figure 2B:
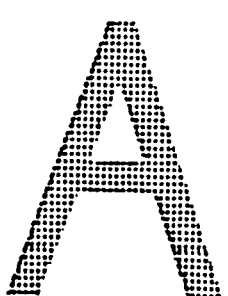
Figure 2C:
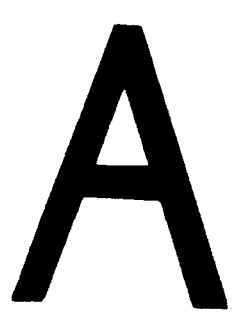

In the layout scanner an accessory program is used so that for a character displayed in the graphic display, the accessory program can define picture element information separately between the character frame portion and the character fill portion. Thus, as shown in FIG. 1, the character frame portion 1 is defined by two areas 1c (which corresponds to a "groove-form cell" described later) and 1f (which also corresponds to a "groove-form cell" described later). The area 1c is an area surrounded by two outside outlines 1a and 1b, and the area 1f is an area surrounded by two inside outlines 1d and 1e. The width of each of the areas 1c and 1f is defined as, for instance, 30 microns, and the areas 1c and 1f having the width of 30 microns and defined by the outlines are provided with black dots (which corresponds to "dot-form projections 3") of predetermined size and shape. Furthermore, the character fill portion 2 is defined as having a shadow-portion dot percentage (e.g. a shade gradient of 75%) as shown in FIG. 1. These values are stored in the memory.

In the above case, it is preferable to form both ends of the character frame portion 1 as sharp triangle end in shape. With this arrangement, the sharp ends of the character frame portion come in point contact with sharp ends of the character frame portions of adjacent characters.

When a plate roll, which has been laser-exposed as described above, is developed/etched, a plate character is formed. In the character frame portion 1, the area 1c, which is defined by continuous two outside outlines parted for 30 microns, becomes a continuous groove-form cell surrounding outside of the plate character when the area 1c is etched. The area 1f, defined by the two inside outlines, becomes a continuous groove-form cell surrounding the inside border of the character when the area 1f is etched. The projections 3 scattered in areas 1c and 1f remain as is without being etched so that the projections 3 prevents the ink flow in the character frame portion when the plate surface is wiped by a doctor.

On the other hand, in the character fill portion 2 (i.e., the area inside the character frame portion), a half-tone etching is performed so that the character fill portion 2 is formed by dot-form cell which has a shadow-portion dot percentage.

When ink is applied to the plate character and transfer printing is performed onto paper, etc., the ink is thick in the character frame portion while it spreads out (as in convention methods) in the character fill portion (i.e. area inside the character frame portion) so that the blank paper areas left by the screen wires disappear. Thus, a printed letter "A" is sharp and black overall and shows no notching.

The method of forming a plate character in a half-tone gravure platemaking process provided by the present invention may also be used in which (a) a laser beam is moved so that a light-sensitive film (silver salt film) wrapped around a drum is subject to a flashing irradiation of laser beams, thus forming, by exposure, character information as aggregates of beam dots, (b) the light-sensitive film is then developed and wrapped around a plate roll coated with another light-sensitive film so that another exposure is performed, and (c) developing-/etching is then performed so that plate characters which are made up of network points are formed.

As describe above, according to the method for forming plate characters in a half-tone gravure platemaking process of the present invention, the ink in the character frame portion is thick and there is no danger that ink flow would occur in the character frame portion. Accordingly, the character frame portion is far sharper than in the case of type printing, achieving high-quality character printing.

I claim:

1. A method for forming plate characters in a half-tone gravure platemaking process, wherein a laser beam is moved so as to be intermittently irradiated onto a light sensitive material, thus forming a plate character on said light-sensitive material by exposure so that said plate character consists of a character frame portion and a character fill portion which is surrounded by said character frame portion, said character frame portion being formed with continuous groove-form cells which have a prescribed length and width and dot-form projections formed in said groove-form cells for preventing ink flow and said character fill portion being formed with dot-form cells which have a shadow-portion dot percentage.

2. A method for forming plate characters in a half-tone gravure platemaking process, wherein in a layout scanner process, character information is defined by a separate character frame portion and a character fill portion which are separated, said character frame portion is formed by continuous groove-form cells which have a prescribed length and width and with dot-form projections and said character fill portion is formed by dot-form cells which have a shadow-portion dot percentage, said character information is stored in a memory, and based upon said character information, a laser beam of a laser exposure device is moved so that a light sensitive material is subjected to an intermittent irradiation of the laser beam thereby causing formation of a plate character on said light-sensitive material by exposure.

* * * * *